(12) United States Patent
Matsuzaki et al.

(10) Patent No.: US 9,236,264 B2
(45) Date of Patent: Jan. 12, 2016

(54) WAFER PROCESSING METHOD

(71) Applicant: DISCO CORPORATION, Tokyo (JP)

(72) Inventors: Sakae Matsuzaki, Tokyo (JP); Hiroyuki Takahashi, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/525,848

(22) Filed: Oct. 28, 2014

(65) Prior Publication Data

US 2015/0132925 A1 May 14, 2015

(30) Foreign Application Priority Data

Nov. 11, 2013 (JP) .................................. 2013-232911

(51) Int. Cl.
| | |
|---|---|
| *H01L 21/304* | (2006.01) |
| *H01L 21/3065* | (2006.01) |
| *H01L 21/78* | (2006.01) |
| *H01L 21/822* | (2006.01) |
| *H01L 21/784* | (2006.01) |

(52) U.S. Cl.
CPC ........ *H01L 21/3043* (2013.01); *H01L 21/3046* (2013.01); *H01L 21/3065* (2013.01); *H01L 21/78* (2013.01); *H01L 21/784* (2013.01); *H01L 21/822* (2013.01)

(58) Field of Classification Search
None
See application file for complete search history.

(56) References Cited

U.S. PATENT DOCUMENTS

| | | | | |
|---|---|---|---|---|
| 4,047,286 | A | * | 9/1977 | Lob et al. ...................... 438/464 |
| 5,691,248 | A | * | 11/1997 | Cronin et al. ................. 438/109 |
| 5,851,894 | A | * | 12/1998 | Ramm ........................... 438/311 |
| 6,121,119 | A | * | 9/2000 | Richards et al. .............. 438/462 |
| 2005/0023689 | A1 | * | 2/2005 | Nicholson et al. ............ 257/758 |
| 2007/0160810 | A1 | * | 7/2007 | Hayashi et al. ............... 428/158 |
| 2008/0213978 | A1 | * | 9/2008 | Henry et al. ................... 438/462 |
| 2012/0119389 | A1 | * | 5/2012 | Menath et al. ................. 257/782 |

FOREIGN PATENT DOCUMENTS

JP       2005-142398       6/2005

* cited by examiner

*Primary Examiner* — Angel Roman
(74) *Attorney, Agent, or Firm* — Greer Burns & Crain, Ltd.

(57) ABSTRACT

A wafer processing method including a mask forming step of forming a mask for covering a region corresponding to each device on a functional layer formed on the front side of a substrate constituting a wafer, a groove forming step of spraying a fluid containing abrasive grains against the front side of the wafer to thereby form a groove for dividing the functional layer along each street, and an etching step of performing dry etching from the front side of the wafer to thereby form an etched groove along each street. Accordingly, it is possible to prevent that the functional layer may be separated to cause damage to each device. Furthermore, a wide area of the wafer can be processed at a time, so that the productivity can be improved.

6 Claims, 5 Drawing Sheets

WAFER PROCESSING METHOD

BACKGROUND OF THE INVENTION

1. Field of the Invention

The present invention relates to a wafer processing method for dividing a wafer into a plurality of devices, the wafer including a substrate and a functional layer formed on the substrate, the plural devices being formed from the functional layer.

2. Description of the Related Art

Conventionally known is a semiconductor wafer including a substrate such as a silicon substrate and a functional layer formed on the front side of the substrate, wherein a plurality of devices are formed from the functional layer. The functional layer is formed by stacking a plurality of low-permittivity insulator films (low-k films). Examples of each low-k film include an inorganic film of $SiO_2$, SiOF, etc., a polymer film of polyimide, parylene, etc., and an organic film of SiOC, etc. Each low-k film is very brittle like mica. Accordingly, when the wafer having the stacked low-k films is cut by using a cutting blade, there arises a problem such that the low-k films may be separated (delamination) to cause damage to the devices. To cope with this problem, there has been proposed a wafer processing method including the steps of applying a laser beam along each street formed on the wafer to form two laser processed grooves along each street which grooves are spaced a given distance greater than the width of the cutting blade, thereby dividing the low-films, and next cutting the area between the two laser processed grooves along each street, whereby the separation of the low-k films can be stopped by the two laser processed grooves to prevent the damage to the devices (see Japanese Patent Laid-open No. 2005-142398, for example).

SUMMARY OF THE INVENTION

However, the wafer processing method described in Japanese Patent Laid-open No. 2005-142398 has the following problems.

(1) The two laser processed grooves must be formed along each street, so as to divide the functional layer, causing a reduction in productivity.

(2) To form the two laser processed grooves along each street, the laser beam must be applied at least twice along each street, so that thermal strain remains in the wafer to cause a reduction in die strength of each device chip.

(3) Since the two laser processed grooves are formed so as to be spaced from each other a given distance greater than the width of the cutting blade, the width of each street must be increased, causing a reduction in number of devices that can be formed on one wafer.

(4) A passivation film of $SiO_2$, SiO, SiN, SiON, etc. is formed on the front side of the functional layer. Accordingly, the laser beam is passed through the passivation film to reach the inside of the functional layer. As a result, heat is generated by the absorption of the laser beam in the functional layer, and this heat is temporarily confined inside the passivation film to laterally spread, so that the separation of the devices low in density is caused in some cases.

It is therefore an object of the present invention to provide a wafer processing method which can prevent damage to the devices due to the separation of the functional layer in dividing the wafer into the devices as chips.

In accordance with an aspect of the present invention, there is provided a wafer processing method for dividing a wafer into a plurality of devices along a plurality of streets formed on the front side of the wafer, the wafer including a substrate and a functional layer formed on the front side of the substrate, the devices being formed from the functional layer and partitioned by the streets, the wafer processing method including a mask forming step of forming a mask for covering a region corresponding to each device on the functional layer of the wafer; a groove forming step of spraying a fluid containing abrasive grains against the front side of the wafer after performing the mask forming step, thereby forming a groove for dividing the functional layer along each street; and an etching step of performing dry etching along each street from the front side of the wafer after performing the groove forming step, thereby forming an etched groove on the substrate along each street.

Preferably, the etched groove formed in the etching step has a depth not reaching the back side of the wafer; and the wafer processing method further includes a thickness reducing step of grinding the back side of the wafer after performing the etching step, thereby reducing the thickness of the wafer to a predetermined thickness.

Preferably, the wafer processing method further includes a mask removing step of removing the mask from the functional layer after performing the etching step.

In the wafer processing method according to the present invention, the mask is formed on the front side of the wafer in the condition where each street is exposed, and the fluid containing abrasive grains is next sprayed against the front side of the wafer to thereby divide the functional layer of the wafer along each street. Thereafter, the same mask is used to perform the dry etching along each street. Accordingly, the following effects can be exhibited.

(1) It is unnecessary to form a plurality of laser processed grooves along each street. Furthermore, a wide area of the wafer can be processed at a time by the spraying of the fluid containing abrasive grains and the dry etching, so that the productivity can be improved as compared with that by the application of a laser beam in laser processing. Particularly in the case that the wafer has a large diameter and each device chip to be manufactured from the wafer has a small size, the number of streets is large. As a result, the improvement in productivity becomes more remarkable in this case.

(2) As described above, the laser processed grooves by the application of a laser beam are not formed in the present invention. Accordingly, there is no possibility that the heat generated by the absorption of a laser beam may be confined in the functional layer, so that the separation of the devices can be prevented. Furthermore, there is no possibility that thermal strain may remain in the wafer, so that a reduction in die strength of each device chip can be prevented.

(3) The wafer is processed along each street by the spraying of the fluid containing abrasive grains and the dry etching rather than by the application of a laser beam to the front side of the wafer. Accordingly, it is unnecessary to increase the width of each street, so that it is possible to increase the number of devices that can be formed on one wafer. Further, it is also possible to divide a wafer in the case that each street is not straight. Accordingly, it is possible to process a wafer having devices of any shapes other than a rectangular shape or devices of various sizes.

(4) In the groove forming step and the etching step, the region corresponding to each device is covered with the mask. Accordingly, it is unnecessary to dedicatedly protect the front side of the wafer.

In the case that the etched groove formed in the etching step has a depth not reaching the back side of the wafer and the back side of the wafer is ground to reduce the thickness of the wafer to a predetermined thickness after performing the etching step, the wafer can be divided without the need for making the etched groove reach the back side of the wafer in the etching step.

In the case that the mask is removed from the functional layer in the mask removing step after performing the etching step, the mask formed in the mask forming step can be used not only in the groove forming step, but also in the etching step. That is, it is unnecessary to form a mask dedicated to etching, so that the number of steps can be reduced.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
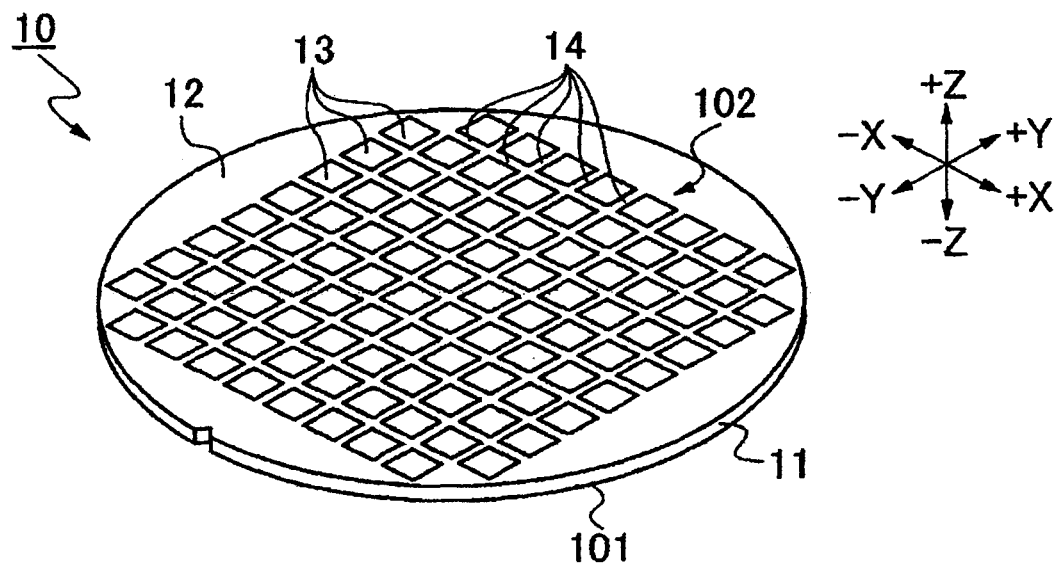
FIG. 1 is a perspective view of a wafer.
Figure 2:
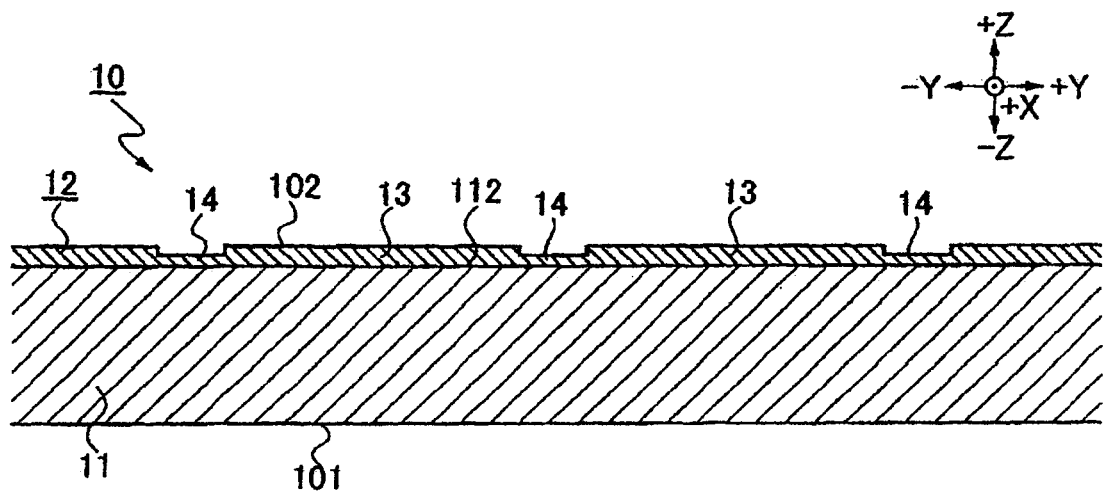
FIG. 2 is an enlarged sectional view of an essential part of the wafer.

Referring to FIG. 1, there is shown a wafer 10. As shown in FIG. 1, a plurality of devices 13 are formed on the front side 102 of the wafer 10, and a plurality of streets 14 are also formed on the front side 102 of the wafer 10 so as to extend in the ±X directions shown by arrows +X and −X and in the ±Y directions shown by arrows +Y and −Y. The front side 102 of the wafer 10 is partitioned by these crossing streets 14 to define a plurality of rectangular regions where the plural devices 13 are respectively formed. As shown in FIG. 2, the devices 13 are formed by a functional layer 12 including a plurality of stacked low-k films and a passivation film. The functional layer 12 is formed on the front side 112 of a circular substrate 11 such as a silicon substrate. The functional layer 12 has a thickness of 10 μm, for example. Examples of each low-k film includes an inorganic film of $SiO_2$, SiOF, etc., a polymer film of polyimide, parylene, etc., and an organic film of SiOC etc.

The passivation film is formed on the uppermost side of the functional layer 12 in the +Z direction shown by an arrow +Z in FIG. 2. Examples of the passivation film include a film of $SiO_2$, SiO, SiN, SiON, etc. The functional layer 12 is exposed to the front side 102 of the wafer 10 while a back side 101 of the substrate 11 is exposed to the back side of the functional layer 12. The level of the front side 102 of the wafer 10 is usually different in the regions where the devices 13 are formed from the regions where the streets 14 are formed as shown in FIG. 2. As a modification, the level of the regions where the devices 13 are formed may be the same as the level of the regions where the streets 14 are formed. By performing the following method, the wafer 10 is divided along the streets 14 into a plurality of device chips respectively corresponding to the plural devices 13. This method will now be described more specifically.

(1) Mask Forming Step

Figure 3:
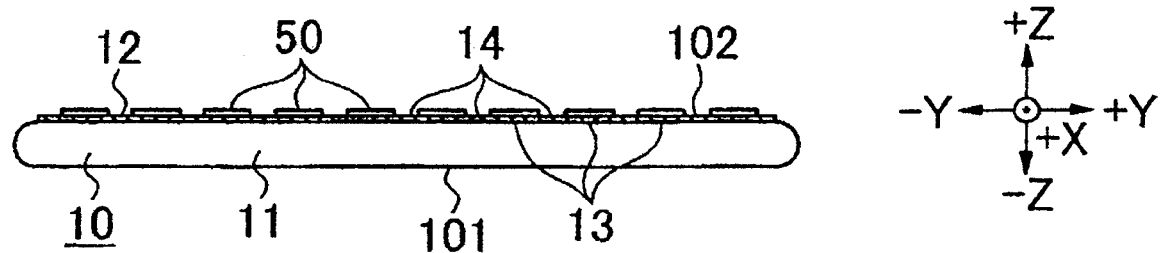
FIG. 3 is a sectional side view of the wafer in the condition where masks have been formed in a mask forming step.

As shown in FIG. 3, a plurality of masks 50 are respectively formed on the regions where the devices 13 are formed, of the functional layer 12 exposed to the front side 102 of the wafer 10. That is, the masks 50 are not formed on the regions where the streets 14 are formed. For example, the masks 50 are formed in the following manner. A photoresist is applied to the front side 102 of the wafer 10. Thereafter, a photomask having a predetermined pattern is next used to expose the photoresist to light and next perform development, thereby removing the photoresist applied to the regions corresponding to the streets 14 and leaving a resist film on the regions corresponding to the devices 13. This resist film is formed as the masks 50 respectively covering the regions corresponding to the devices 13.

(2) Groove Forming Step

Figure 4:
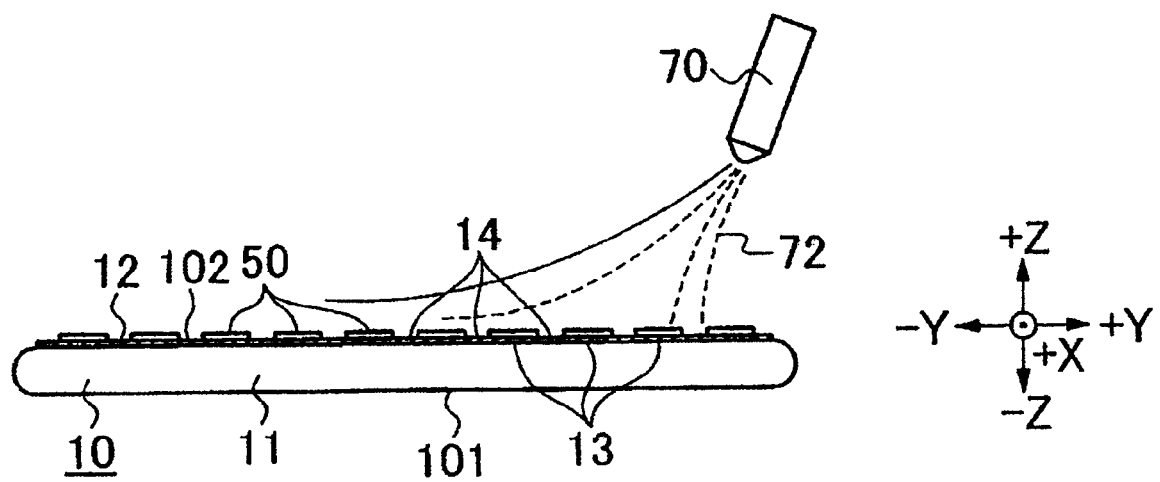
FIG. 4 is a sectional side view showing a groove forming step.

After performing the mask forming step mentioned above, a fluid 72 is sprayed against the wafer 10 from spraying means 70 located above the wafer 10 as shown in FIG. 4. Examples of the fluid 72 include compressed air and liquid. The fluid 72 contains abrasive grains of white alumina, ceria, silica, etc. The kind of the fluid 72 and the abrasive grains, the size of the abrasive grains, etc. may be suitably selected according to the material of the functional layer 12, a process quality to be required, etc. The spraying means 70 has one or more nozzle holes.

Figure 5:
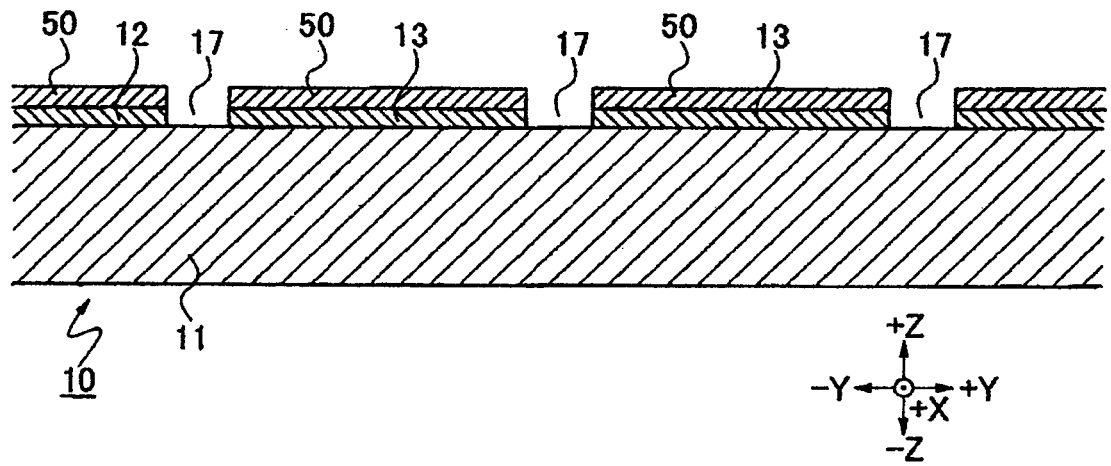
FIG. 5 is an enlarged sectional view of the wafer in the condition where division grooves have been formed in the groove forming step.

By spraying the fluid 72 containing the abrasive grains against the front side 102 of the wafer 10, a plurality of division grooves 17 for dividing the functional layer 12 are formed along the regions not covered with the masks 50, i.e., along the streets 14 as shown in FIG. 5. In this manner, the division grooves 17 are formed by blasting with the abrasive grains. Accordingly, even in the case that metal is included in the regions corresponding to the streets 14 of the functional layer 12, for example, in the case that TEG (Test Element Group) is present on the streets 14, the functional layer 12 can be divided in the groove forming step. The division grooves 17 must be formed so as to divide at least the functional layer 12. That is, the substrate 11 may be eroded by the division grooves 17 or may not be eroded by the division grooves 17 with only the functional layer 12 removed along the streets 14.

(3) Etching Step

Figure 6:
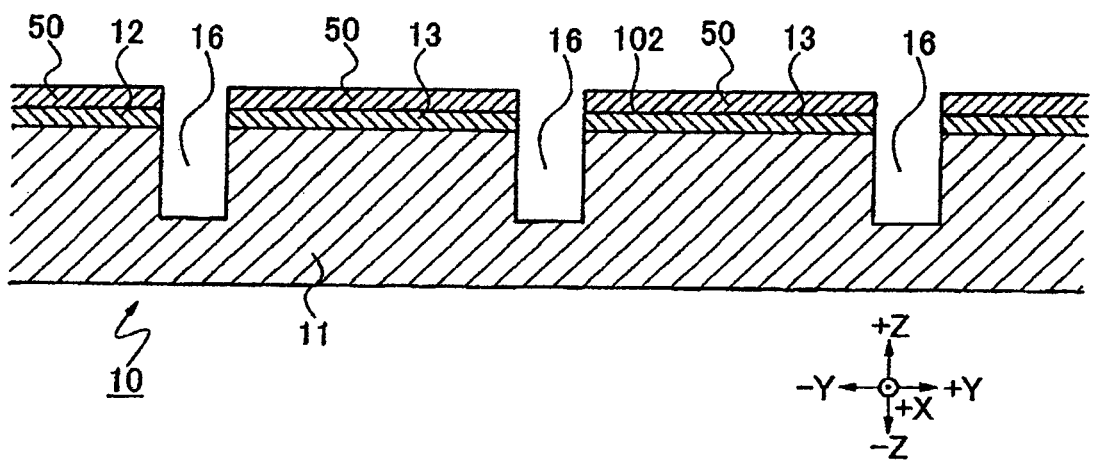
FIG. 6 is an enlarged sectional view of the wafer in the condition where etched grooves have been formed in an etching step.

After performing the groove forming step mentioned above, dry etching is performed to the wafer 10 from the front side 102 thereof to thereby form a plurality of etched grooves 16 on the substrate 11 in the regions not covered with the masks 50, i.e., along the streets 14 as shown in FIG. 6. An etching gas to be used in this etching step is suitably selected according to the material of the substrate 11. For example, in the case that the substrate 11 is formed of silicon, $SF_6$, $NF_3$, $XeF_2$, etc. may be used as the etching gas. For example, the etching step may be performed under the following conditions A and B in combination. As the condition A, $SF_6$ gas is supplied at a rate of 1500 cc/min, and a radio-frequency power of 3000 W is applied to a plasma generating portion, whereas a radio-frequency power of 300 W is applied to the silicon substrate. As the condition B, $C_4F_8$ gas is supplied at a rate of 1000 cc/min, and a radio-frequency power of 3000 W is applied to the plasma generating portion, whereas a radio-frequency power of 0 W is applied to the silicon substrate. The condition A and the condition B are alternately repeated under a processing pressure of 10 Pa in such a manner that the duration of the condition A is set to 0.6 second and the duration of the condition B is set to 0.4 second, thereby etching the silicon substrate. The silicon substrate is etched at a high rate under the condition A, and a protective film is formed on the side walls of each etched groove under the condition B. Accordingly, the silicon substrate can be etched at a high rate with a high aspect ratio. By performing this etching for four minutes, an etched groove having a depth of 100 μm can be formed in the silicon substrate.

In this manner, the etching step is performed to form the etched grooves 16 along the streets 14, wherein the etched grooves 16 are respectively continuous to the division grooves 17. It is essential that the depth of each etched groove 16 is set to a value not less than the finished thickness (e.g., 100 μm) of each device chip to be manufactured. That is, the depth of each etched groove 16 may be set so as not to reach the back side 101 of the substrate 11.

As described above, the dry etching is performed in combination with the blasting to thereby form the etched grooves 16 respectively continuous to the division grooves 17. The functional layer 12 is divided by the blasting because it cannot be etched. In the blasting, the aspect ratio (width:depth) of each division groove 17 is about 1:1 to 1:2, so that a deep groove cannot be formed. On the other hand, the etched grooves 16 are formed by the dry etching rather than the blasting after dividing the functional layer 12, so that a relatively deep groove can be accurately formed as each etched groove 16.

(4) Mask Removing Step

Figure 7:
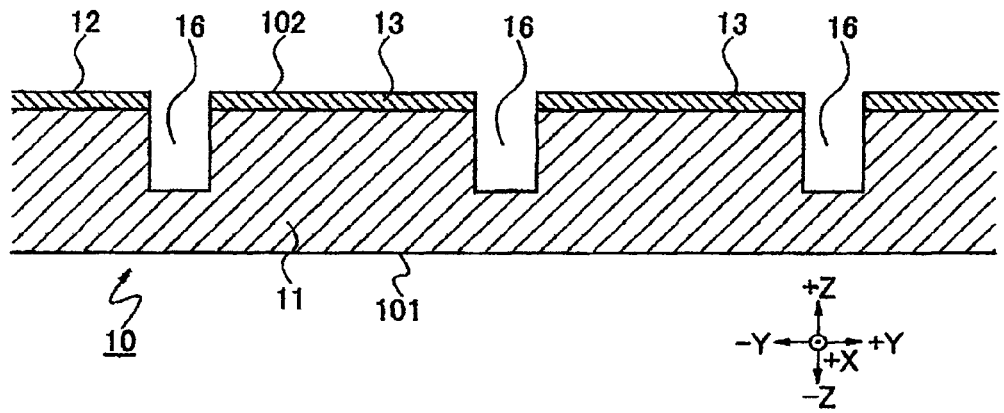
FIG. 7 is an enlarged sectional view of the wafer in the condition where the masks have been removed in a mask removing step.

As shown in FIG. 7, the masks 50 are removed from the functional layer 12 of the wafer 10 after performing the etching step. For example, a photoresist film remover may be used to remove the masks 50. The masks 50 formed in the mask forming step are used not only in the groove forming step, but also in the etching step. Thereafter, the masks 50 are removed in the mask removing step. Accordingly, it is unnecessary to form masks dedicated to etching, so that the number of steps can be reduced.

(5) Thickness Reducing Step

Figure 8:
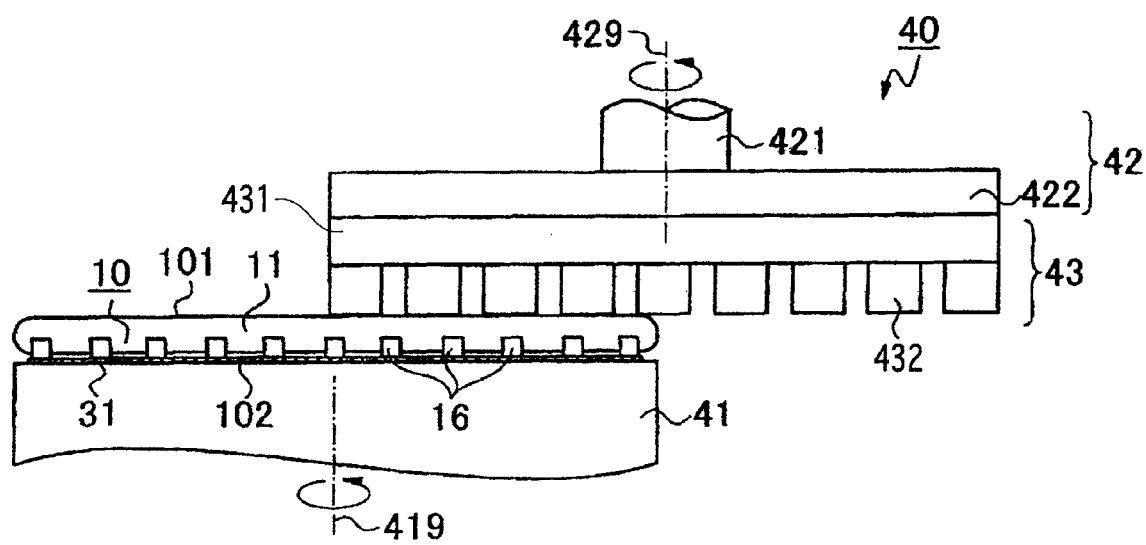
FIG. 8 is a sectional side view showing a thickness reducing step.

After performing the mask removing step mentioned above, the back side 101 of the wafer 10 is ground by using a grinding apparatus 40 shown in FIG. 8, thereby reducing the thickness of the wafer 10 to a predetermined thickness. This grinding apparatus 40 includes holding means 41 for holding a workpiece and grinding means 42 for grinding the workpiece held on the holding means 41. The holding means 41 is rotatable about an axis 419. The grinding means 42 includes a spindle 421 rotatable about an axis 429 and a mount 422 connected to the lower end of the spindle 421. A grinding wheel 43 is mounted on the lower surface of the mount 422. The grinding wheel 43 is composed of a base 431 and a plurality of abrasive members 432 fixed to the lower surface of the base 431.

Prior to grinding the back side 101 of the wafer 10, a protective member 31 such as a protective sheet for protecting the devices 13 is attached to the front side 102 of the wafer 10. The wafer 10 is held on the holding means 41 in the condition where the protective member 31 attached to the front side 102 of the wafer 10 is in contact with the holding means 41. That is, the back side 101 of the wafer 10 held on the holding means 41 is exposed. The protective member 31 may be a hard plate of glass, silicon, etc.

Figure 9:
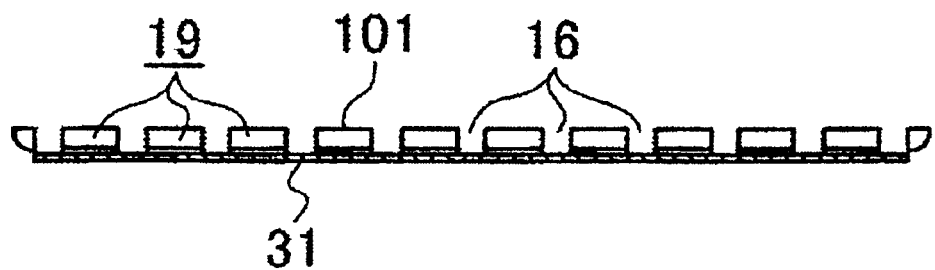
FIG. 9 is a sectional side view showing device chips divided from the wafer in the thickness reducing step.

In grinding the back side 101 of the wafer 10, the grinding means 42 is lowered as rotating the spindle 421 to bring the abrasive members 432 of the rotating grinding wheel 43 into contact with the exposed back side 101 of the wafer 10, thereby grinding the back side 101 of the wafer 10. When the thickness of the wafer 10 is reduced to the finished thickness (e.g., 100 μm) of each device chip to be manufactured, this grinding step is finished. By grinding the back side 101 of the wafer 10 as mentioned above, the etched grooves 16 are exposed to the back side 101 of the wafer 10, so that the wafer 10 is divided by the etched grooves 16 to obtain a plurality of device chips 19 respectively corresponding to the plural devices 13 as shown in FIG. 9.

(6) Transfer Step

Figure 10:
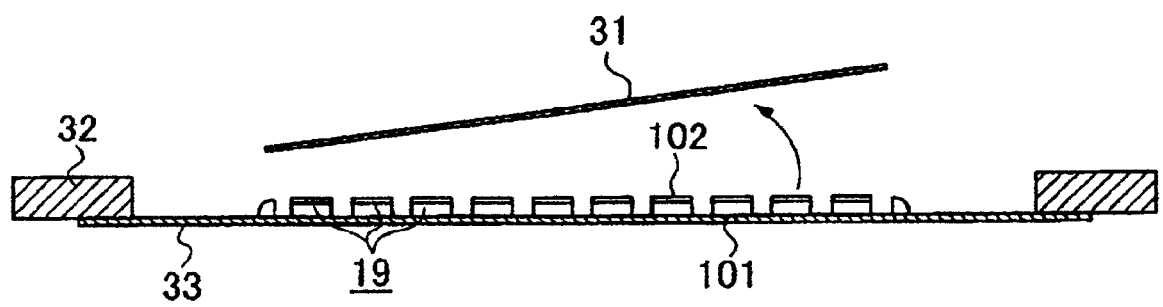
FIG. 10 is a sectional side view showing a transfer step.

As shown in FIG. 10, an adhesive tape 33 is attached to the back side 101 of the wafer 10 (the device chips 19) attached to the protective member 31 after performing the thickness reducing step mentioned above. An annular frame 32 is preliminarily attached to the peripheral portion of the adhesive tape 33. Accordingly, the device chips 19 are supported through the adhesive tape 33 to the annular frame 32. Thereafter, the protective member 31 is removed from the front side 102 of the wafer 10 (the device chips 19) in the condition where the adhesive tape 33 is oriented downward and the protective member 31 is oriented upward. In this manner, the device chips 19 are transferred from the protective member 31 to the adhesive tape 33, and the front side 102 of the wafer 10 (the device chips 19) are exposed. Thereafter, each device chip 19 is picked up from the adhesive tape 33.

As described above, no cutting blade is used to divide the wafer 10 in the present invention. That is, the masks 50 are formed on the front side 102 of the wafer 10 in the condition where the streets 14 are exposed, and the fluid 72 containing the abrasive grains is next sprayed against the front side 102 of the wafer 10 to thereby divide the functional layer 12 of the wafer 10 along the streets 14. Thereafter, the same masks 50 are used to perform the dry etching along the streets 14, thereby etching the substrate 11 of the wafer 10 along the streets 14. Accordingly, it is possible to prevent that the low-k films constituting the functional layer 12 may be separated to cause damage to the devices 13.

In the groove forming step, the division grooves 17 are formed by the blasting. In the etching step, the etched grooves 16 are formed by the dry etching so as to respectively correspond to the division grooves 17. Accordingly, it is unnecessary to form a plurality of laser processed grooves along each street as in the prior art. Furthermore, a wide area of the wafer 10 can be processed at a time, so that the productivity can be improved as compared with that in laser processing or cutting. Particularly in the case that the number of streets 14 is large as in the case that the wafer 10 has a large diameter (e.g., 450 mm or more) and each device chip 19 has a small size (e.g., 1 mm square or less), the processing time can be reduced as compared with that required in laser processing or cutting, thereby greatly improving the productivity.

It is unnecessary to form laser processed grooves for preventing the separation of the low-k films. Accordingly, there is no possibility that the heat generated by the absorption of a laser beam may be confined in the functional layer 12, so that the separation of the devices 13 can be prevented. Furthermore, there is no possibility that thermal strain due to the application of a laser beam may remain in the wafer 10, so that a reduction in die strength of each device chip 19 can be prevented. Furthermore, since no laser beam is applied to the front side of the wafer 10, it is unnecessary to increase the width of each street 14, so that it is possible to increase the number of device chips 19 that can be manufactured from the single wafer 10.

Unlike the cutting and laser processing, the blasting and dry etching are advantageous because the shape of a portion to be masked by the masks 50 can be flexibly set. Accordingly, each street 14 may be a curved line rather than a straight line, so that the shape of each device chip 19 is not limited to a rectangular shape. Further, various devices having different sizes can be located on the single wafer 10. Thus, the design flexibility in locating the devices 13 can be increased, so that it is possible to increase the number of device chips 19 that can be manufactured from the single wafer 10.

The mask removing step is to be performed after performing the etching step. Accordingly, the masks 50 may be removed after grinding the wafer 10 to thereby divide the wafer 10 into the device chips 19. For example, the masks 50 may be removed after transferring the device chips 19 to the adhesive tape 33 and removing the protective member 31 in the transfer step.

Further, the thickness reducing step may be performed before performing the etching step rather than after performing the etching step. For example, the protective member 31 is attached to the front side 102 of the wafer 10, and the back side 101 of the wafer 10 is ground to reduce the thickness of the wafer 10. Thereafter, the wafer 10 is transferred to the adhesive tape 33, and the protective member 31 is removed to expose the front side 102 of the wafer 10. Thereafter, the masks 50 are formed on the front side 102 of the wafer 10, and the blasting and dry etching are performed to form the division grooves 17 and the etched grooves 16. In this case, at the time the etched grooves 16 reach the back side 101 of the wafer 10, the wafer 10 is divided. As a modification, just before the etched grooves 16 reach the back side 101 of the wafer 10, the etching may be finished. Thereafter, an external force may be applied to the wafer 10 to thereby divide the wafer 10.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for dividing a wafer into a plurality of devices along a plurality of streets formed on a front side of said wafer, said wafer including a substrate and a functional layer formed on a front side of said substrate, said devices being formed from said functional layer and partitioned by said streets, wherein areas corresponding to said streets include metal regions thereon, said wafer processing method comprising:
   a mask forming step of forming a mask for covering a region corresponding to each device on said functional layer of said wafer;
   a groove forming step of spraying a fluid containing abrasive grains against the front side of said wafer after performing said mask forming step, thereby forming a groove for dividing said functional layer along each street, wherein said groove is formed by removal of a portion of said functional layer, including removal of portions of said metal regions, by spraying said fluid containing abrasive grains; and
   an etching step of performing dry etching along each street from the front side of said wafer after performing said groove forming step, thereby forming an etched groove on said substrate along each street.

2. The wafer processing method according to claim 1, wherein said etched groove formed in said etching step has a depth not reaching the back side of said wafer; and
   said wafer processing method further comprises a thickness reducing step of grinding a back side of said wafer after performing said etching step, thereby reducing the thickness of said wafer to a predetermined thickness.

3. The wafer processing method according to claim 1, further comprising a mask removing step of removing said mask from said functional layer after performing said etching step.

4. The wafer processing method according to claim 1, wherein the functional layer comprises a plurality of stacked low-k films and a passivation film.

5. The wafer processing method according to claim 4, wherein said low-k film comprises an inorganic film, a polymer film, and an organic film.

6. The wafer processing method according to claim 4, wherein the passivation film comprises a film of a material selected from the group consisting of $S_iO_2$, $S_iO$, $S_iN$, and $S_iON$.

* * * * *